United States Patent [19]

Kwon

[11] Patent Number: 5,654,919

[45] Date of Patent: Aug. 5, 1997

[54] ELECTRICALLY ERASABLE PROGRAMMABLE READ ONLY MEMORY

[75] Inventor: Gyu Wan Kwon, Kyungki-Do, Rep. of Korea

[73] Assignee: Hyundai Electronics Industries Co., Ltd., Kyungki-Do, Rep. of Korea

[21] Appl. No.: 576,216

[22] Filed: Dec. 21, 1995

[30] Foreign Application Priority Data

Dec. 30, 1994 [KR] Rep. of Korea ............. 94-39469

[51] Int. Cl.$^6$ .......................................... G11C 7/02
[52] U.S. Cl. ..................... 365/185.21; 365/185.2; 365/210
[58] Field of Search ............................. 365/205, 207, 365/208, 210, 185.2, 185.21; 327/56, 51

[56] References Cited

U.S. PATENT DOCUMENTS

| 5,091,888 | 2/1992 | Akaogi | 365/210 |
|---|---|---|---|
| 5,255,233 | 10/1993 | Izumi | 365/207 |
| 5,282,169 | 1/1994 | Pascucci et al. | 365/210 |
| 5,321,660 | 6/1994 | Sani et al. | 365/210 |
| 5,528,543 | 6/1996 | Stiegler | 365/210 |
| 5,528,544 | 6/1996 | Kohno | 365/207 |

*Primary Examiner*—David C. Nelms
*Assistant Examiner*—Hien Nguyen
*Attorney, Agent, or Firm*—Fish & Richardson P.C.

[57] ABSTRACT

The present invention relates to a sense amplifier, and more particularly to a sense amplifier which raises the sensing current by connecting serially the transistors which are inputs to the output signal from the additional sense amplifier to the bit lines, and then turning on the transistors connected to the bit lines when the current flowing through the memory cell is lower than the expected design current value during a read-out operation.

3 Claims, 3 Drawing Sheets

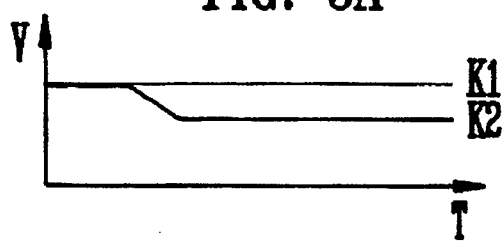
FIG. 3A
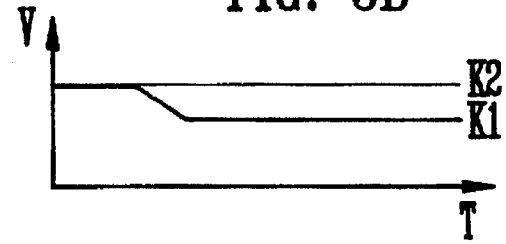
FIG. 3B
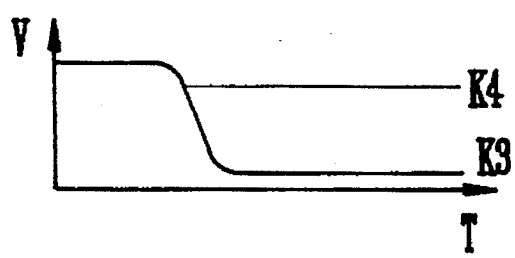
FIG. 3C
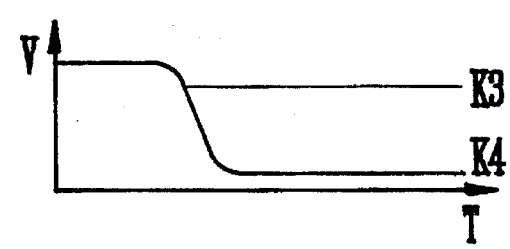
FIG. 3D
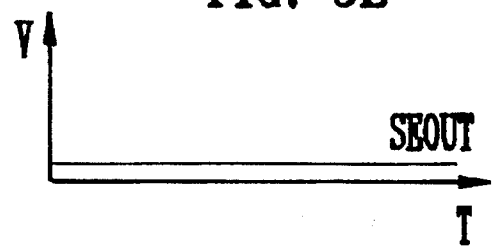
FIG. 3E
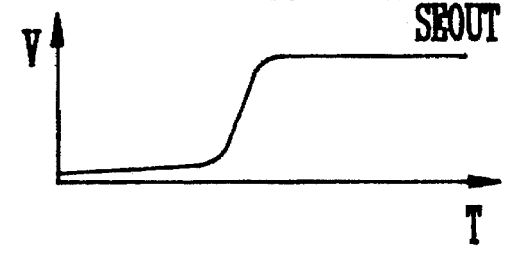
FIG. 3F
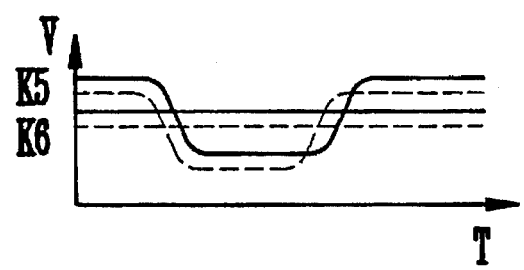
FIG. 4
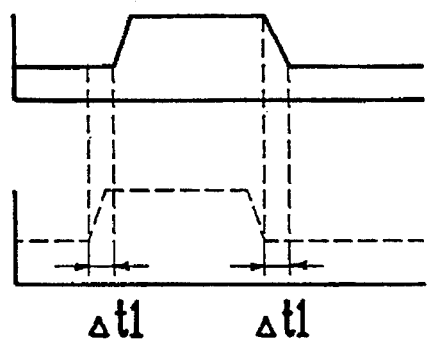
FIG. 5A
FIG. 5B

ELECTRICALLY ERASABLE PROGRAMMABLE READ ONLY MEMORY

FIELD OF THE INVENTION

The present invention relates to an EEPROM, and more particularly an EEPROM having to a sense amplifier which raises the sensing current by connecting serially the transistor to which the output signal from the additional sense amplifier is input to the bit line, and then turning on the transistor connected to the bit line when the current flowing through the memory cell is lower than the expected design current value during a read-out operation.

BACKGROUND THE INVENTION

In general, in reading out data in the EEPROM (Electrically Erasable Programmable Read Only Memory) cell, the sensing speed depends on the threshold voltage in the memory cell.

There happens a case in which the threshold voltage of the completed memory cell is higher than the threshold voltage of the memory cell in design due to the variations in the process conditions while manufacturing the memory cell. In case of reading out data which are stored in such memory cell, some drawbacks requiring to redesign the sense amplifier or to use various options are occurred because the sensing speed varies.

SUMMARY OF THE INVENTION

Accordingly, the purpose of the present invention is to provide an EEPROM having a sense amplifier which can overcome the above drawbacks and can raise the sensing current by connecting serially the transistor to which to the output signal from the additional sense amplifier is input to the bit lines, and then turning on the transistor connected to the bit line when the current flowing through the memory cell is lower than the expected design current value during a read-out operation.

To accomplish the above purpose, an EEPROM according to the present invention, comprises: a plurality of memory cells which are selected based on a wordline select signal and an address signal; a first means for supplying a constant voltage to a selected memory cell of the memory cells which are connected to the bit lines with the first means having a first output node; a reference unit to generate a constant voltage, a second means connected between the reference unit and a power supply source, the second means having a second output node and used for constantly maintaining a potential of the second node; a second sense amplifier to sense the difference in a potential between the first and second nodes; and a third means for sensing a threshold voltage of memory cell dropping the voltage level in the first and second nodes output it in case the threshold voltage in the memory cell is higher than that in a design value.

BRIEF DESCRIPTION OF THE DRAWINGS

For fuller understanding of the nature and objects of the invention, reference should be had to the following detailed description taken in conjunction with the accompanying drawings in which:

FIG. 3A through FIG. 3F show waveforms for each node in FIG. 1;

FIG. 4 shows a waveform for explaining FIG. 3;

FIG. 5A shows an output waveform of a conventional sense amplifier; and

FIG. 5B shows an output waveform of the sense amplifier used with the present invention.

Similar reference characters refer to similar parts through the several views of the drawings.

DESCRIPTION OF THE INVENTION

Below, the present invention will be described in detail with reference to the accompanying drawings.

Figure 1:
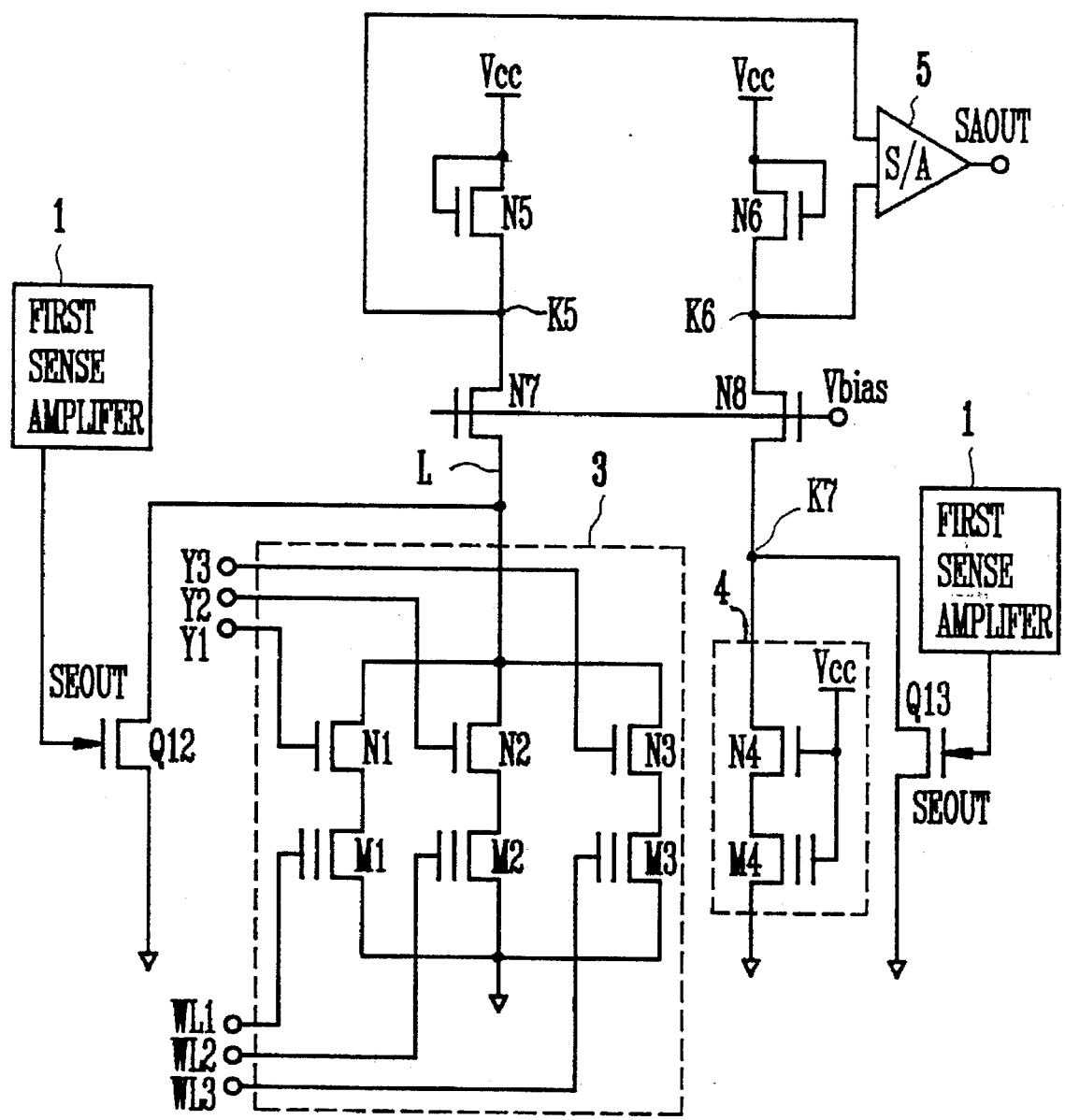
FIG. 1 shows a memory device according to the present invention.

FIG. 1 shows a memory device according to the present invention.

The transistors N1, N2, and N3 in the memory block 3 are selectively turned on based on the address signals Y1, Y2 and Y3. The memory cells M1, M2 and M3 in the memory block 3 are selectively driven based on the wordline select signals WL1, WL2 and WL3. The reference unit 4 is comprised of the transistor N4 and the virgin memory cell M4 which are connected in serial. When the power supply Vcc is supplied to the transistor N4 and the memory cell M4, a constant voltage is maintained at the node K7. As the transistors N7 and N8 are turned on by means of a bias voltage $V_{bias}$, a constant voltage is maintained at the second output node K6. The transistors N5 and N6 operates like a diode and the Vcc drop them by threshold voltage.

The read-out operation for the memory cell will be explained.

We assume that the memory cell M1 is selected by means of the address signal Y1 and the wordline select signal WL1.

If the memory cell M1 is in an erasure state, the current is caused to flow to the ground via the transistors N5, N7 and N1 and the memory cell M1 because the threshold voltage thereof is maintained, for example at −2 V. Therefore, the voltage of the first output node K5 becomes a "LOW" level. The difference in a potential between the first and the second output nodes K5 and K6 is sensed by the second amplifier 5.

For example, if the threshold voltage is designed at −2 V in design when erasing the memory cells M1, M2 and M3, but it is practically manufactured at −1.5 V due to the manufacturing processes, the sensing point of the second sense amplifier 5 must be varied because the voltage level of the node K5 becomes higher than that in the normal state.

Accordingly, in case the threshold voltage of the manufactured memory cell is higher than the threshold voltage in design, the first sense amplifier 1 senses it and then turns the first and the second transistors Q12 and Q13.

As the first and the second transistors Q12 and Q13 are NMOS transistors, the threshold voltage thereof can be controlled freely. That is, in case the threshold voltage of the memory cells M1, M2 and M3 is designed at −2 V but it is manufactured at −1.5 V, we have to let the sensing current of the bit line L to be same with the sensing current in design making use of the transistor Q12. That is, as shown in FIG. 4, the voltage level in the first and the second output nodes K5 and K6 is lowered. In FIG. 4, the solid lines means that there does not exist the first and the second transistors Q12 and Q13, and the dotted lines means that the first and the second transistors Q12 and Q13 operate.

FIG. 5A shows an output waveform of the second sense amplifier 5 in a case in which the transistors Q12 and Q13 are not constructed when the threshold voltage in the memory cell is varied, FIG. 5B shows an output waveform of the second sense amplifier 5 in a case in which the transistors Q12 and Q13 are operated. As shown in the Figure, according to the present invention, the sensing speed will be higher by Δt1.

Figure 2:
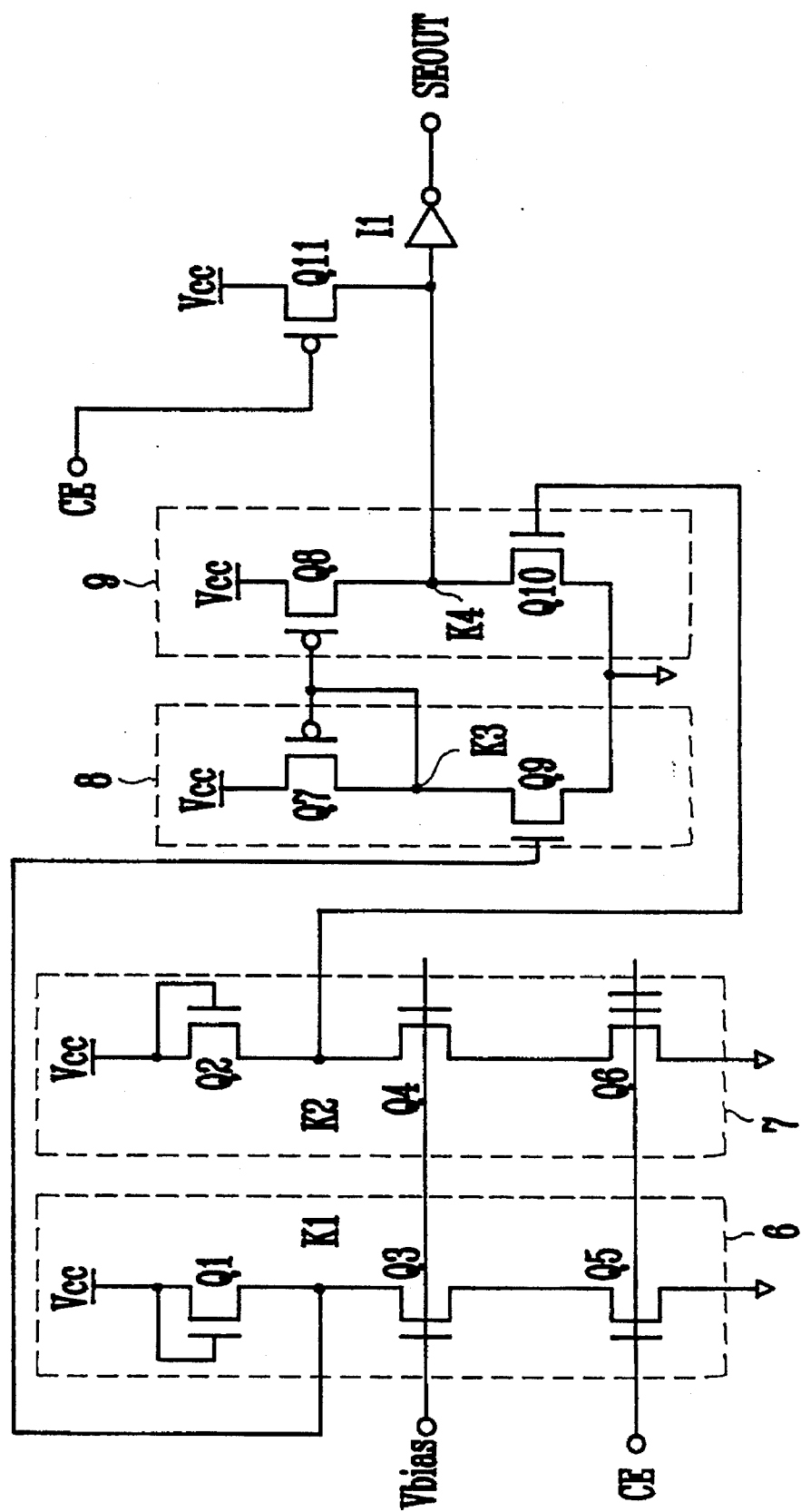
FIG. 2 shows a detailed circuit of a first sense amplifier shown in FIG. 1.

FIG. 2 shows a detailed circuit of a first sense amplifier shown in FIG. 1. That is, FIG. 2 shows a circuit which is able to detect the variation in threshold voltage in the memory cell.

The first current source 6 is comprised of the transistors Q1, Q3, and Q5 which are connected serially between the power supply source Vcc and the ground. The second current source 7 is comprised of the transistors Q2, Q4, and Q6 which are connected serially between the power supply source Vcc and the ground. The third current source 8 is comprised of the transistors Q7 and Q9 which are also connected serially between the power supply Vcc and the ground. The fourth current source 9 is comprised of the transistors Q8 and Q10 which are connected serially between the power supply Vcc and the ground.

The transistor Q6 is a reference memory cell. The transistor Q5 is designed to have a threshold voltage corresponding to that in a design target in the reference memory cell Q6. First, in case the threshold voltage in the reference memory cell Q6 is same with or lower than that in the design target, an expected sensing speed can be obtained or a more faster sensing speed can be obtained because the current in the memory cell is same with the target value or more than that. That is, in FIG. 1, a more current is not required to flow by turning on the transistors Q12 and Q13.

The transistors Q3, Q4, Q5 and Q6 are turned on by means of the chip enable CE and the bias voltage $V_{bias}$, but the transistor Q11 is turned off. If the threshold voltage of the transistor Q6 is lower than that of the transistor Q5, the current driving force of the transistor Q6 is great. That is, as shown in FIG. 3A, the voltage level in the second node K2 of FIG. 2 is more lower than that in the first node K1 of FIG. 2. The voltage level in the nodes K1 and K2 of FIG. 1 drives the transistors Q9 and Q10 respectively. Therefore, as shown in FIG. 3C, the voltage level in the fourth node K4 of FIG. 2 is more higher than that in the third node K3 of FIG. 2. The difference in a potential between the third and the fourth nodes K3 and K4 of FIG. 1 is greater than that between the K1 and K2 of FIG. 2. As the fourth node K4 of FIG. 2 is maintained at enough "HIGH" state, the SEOUT which is an output from the inverter I1 is a "LOW" level as shown in FIG. 3E. Therefore, the transistor Q12 and Q13 in FIG. 2 are turned off and then they operate the second sense amplifier 5.

In case the threshold voltage in the reference memory cell Q6 is higher than that in the design target, as the current flowing in the memory cell is small than that the target value, the transistors Q12 and Q13 must be turned on to flow a more current in order to obtain an expected sensing speed. To accomplish this purpose, the transistors Q3, Q4, Q5 and Q6 are turned on as described above. The current driving force is small because the threshold voltage in the transistor Q6 is higher than that in the transistor Q5. That is, as shown in FIG. 3B, the voltage level in the second node K2 of FIG. 2 is more higher than that in the first node K1 of FIG. 2. The voltage levels in the first and the second nodes K1 and K2 of FIG. 2 drive the transistors Q9 and Q10. As shown in FIG. 3D, the voltage level in the fourth node K4 of FIG. 2 becomes lower than that in the third node K3 of FIG. 1. As the fourth node K4 of FIG. 2 is in a enough "LOW" state, the SEOUT which is an output from the inverter I1 becomes a "HIGH" level as shown in FIG. 3F. Therefore, the voltage in the bit line L is dropped because the transistors Q12 and Q13 in FIG. 2 are turned on. Accordingly, the sensing speed is improved.

As described above, the present invention has an outstanding effect in obtaining a stable sensing speed by connecting serially the transistors which are inputs to the output signal of the sense amplifier to the bit lines, and then turning on the transistors connected to the bit lines when the current flowing through the memory cell is lower than the expected design current value during a read-out operation, so resulting in raising the sensing current.

The foregoing description, although described in its preferred embodiment with a certain degree of particularity, is only illustrative of the principle of the present invention. It is to be understood that the present invention is not to be limited to the preferred embodiments disclosed and illustrated herein. Accordingly, all expedient variations that may be made within the scope and spirit of the present invention are to be encompassed as further embodiments of the present invention.

We claim:

1. An EEPROM, comprising:

a plurality of memory cells which are selected based on a wordline select signal and an address signal, a first means for supplying a constant voltage to a selected memory cell of said memory cells which are connected to bit lines, said first means having a first output node;

a reference unit to generate a constant voltage;

a second means, connected between said reference unit and a power supply source, said second means having a second output node for maintaining a constant potential at said second node;

a second sense amplifier to sense a difference in potential between said first and second output nodes; and a third means for sensing a threshold voltage of said memory cell and dropping the voltage level in said first and second output nodes when the threshold voltage in said memory cell is higher than that in a design value.

2. An EEPROM, comprising:

a plurality of memory cells which are selected based a wordline select signal and an address signal, a first means for supplying a constant voltage to a selected memory cell of said memory cells which are connected to bit lines, said first means having a first output node;

a reference unit to generate a constant voltage;

a second means connected between said reference unit and a power supply source, said second means having a second output node for maintaining a constant potential at said second node;

a second sense amplifier to sense a difference in potential between said first and second output nodes; and a third means for sensing a threshold voltage of said memory cell and dropping the voltage level in said first and second output nodes when the threshold voltage in said memory cell is higher than that in a design value; wherein said third means comprises a first transistor connected between said bit lines and the ground, a second transistor connected serially to said reference unit, and a first sense amplifier to generate the output which controls said first and second transistors by sensing the threshold voltage in said memory cell.

3. An EEPROM, comprising:

a plurality of memory cells which are selected based on a word line select signal and an address signal, a first means for supplying a constant voltage to a selected memory cell of said memory cells which are connected to bit lines, said first means having a first output node;

a reference unit to generate a constant voltage;

a second means connected between said reference unit and a power supply source, said second means having a second output node for maintaining a constant potential at said second node;

a second sense amplifier to sense a difference in a potential between said first and second output nodes; and a third means for sensing a threshold voltage of said memory cell and dropping the voltage level in said first and second output nodes when the threshold voltage in said memory cell is higher than that in a design value;

wherein said third means comprises a first transistor connected between said bit lines and ground, a second transistor connected serially to said reference unit, and a first sense amplifier to generate the output which controls said first and second transistors by sensing the threshold voltage in said memory cell, and wherein said first sense amplifier comprises:

a first current source having a first node, in which a constant current flows between the power supply source and the ground based on the bias voltage and the chip enable signal;

a second current source having a second node, in which a constant current flows between the power supply source and the ground based on the bias voltage and the chip enable signal and the threshold voltage in the reference memory cell;

a third current source having a third node, in which a constant current flows between the power supply source and the ground based on the threshold voltage in said first node; and a fourth current source having a fourth node, in which a constant current flows between the power supply source and the ground based on the threshold voltage in said second node, said first and second transistors are controlled based on the voltage level of said fourth node in said fourth current source.

* * * * *